United States Patent
Ito

(10) Patent No.: US 6,636,090 B2
(45) Date of Patent: Oct. 21, 2003

(54) PHASE-LOCKED LOOP CIRCUIT OUTPUTTING CLOCK SIGNAL HAVING FIXED PHASE DIFFERENCE WITH RESPECT TO INPUT CLOCK SIGNAL

(75) Inventor: Yoshiaki Ito, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/850,095

(22) Filed: May 8, 2001

(65) Prior Publication Data

US 2002/0060591 A1 May 23, 2002

(30) Foreign Application Priority Data

Nov. 20, 2000 (JP) ........................................ 2000-353383

(51) Int. Cl.[7] ................................................. H03L 7/06

(52) U.S. Cl. ........................... 327/157; 327/5; 327/148; 331/25; 331/DIG. 2; 375/376

(58) Field of Search .......................... 327/144, 146–148, 327/155–157, 162, 163, 3, 5, 7, 12, 236, 243, 244; 375/371, 373–376, 362, 327; 331/11, 12, 17, 25, 1 A, 40, 177 R, DIG. 2; 365/233, 233.5

(56) References Cited

U.S. PATENT DOCUMENTS

| | | | |
|---|---|---|---|
| 4,297,650 A | 10/1981 | Shinmyo | 331/11 |
| 5,341,405 A | 8/1994 | Mallard, Jr. | |
| 5,917,352 A | * 6/1999 | Dunlap et al. | 327/12 |
| 5,953,386 A | * 9/1999 | Anderson | 327/156 |
| 6,198,355 B1 | * 3/2001 | Lindquist et al. | 327/12 |
| 6,259,278 B1 | * 7/2001 | Huang | 327/12 |

FOREIGN PATENT DOCUMENTS

| | | |
|---|---|---|
| DE | 197 51 269 | 11/1998 |
| JP | 10242852 | 9/1998 |
| JP | A 2000-36729 | 2/2000 |

* cited by examiner

Primary Examiner—Timothy P. Callahan
Assistant Examiner—Minh Nguyen
(74) Attorney, Agent, or Firm—Burns, Doane, Swecker & Mathis, LLP

(57) ABSTRACT

A phase-locked loop circuit includes a first PFD (phase detector) and a second PFD. The first PFD accepts an input clock signal CLK and a feedback clock signal FBCLK, and supplies its positive output to a charge pump. The second PFD accepts an inverted signal NCLK of the input clock signal CLK and the feedback clock signal FBCLK, and supplies its negative output to the charge pump. The phase-locked loop circuit outputs the clock signal whose phase differs from the phase of the input clock signal by 90 degrees.

4 Claims, 6 Drawing Sheets

101 (1,2,11,12)

102 (3,13)

102 (3,13)

PHASE-LOCKED LOOP CIRCUIT OUTPUTTING CLOCK SIGNAL HAVING FIXED PHASE DIFFERENCE WITH RESPECT TO INPUT CLOCK SIGNAL

BACKGROUND OF THE INVENTION

1. Field of the Invention

The present invention relates to a phase-locked loop circuit for producing an output clock signal having a fixed phase difference with respect to its input clock signal.

2. Description of Related Art

Recently, the rate of the clock signal for an LSI (Large Scale Integrated circuit) has been increasing with the development of the micro-fabrication technique of the LSI. As a result, the margin is reduced of the phase difference between the clock signal of a system on which the LSI is mounted and the clock signal within the LSI. Thus, demand is increasing for using a phase-locked loop circuit that can compensate for the phase difference.

Likewise, the number of data signals input to the LSI is also increasing with the development of the micro-fabrication technique of the LSI. As a result, it becomes more difficult to establish synchronization between the data signals and the input clock signal because of the delay involved in the signal processing. Thus, demand is increasing for a circuit that can output a clock signal having a phase difference with respect to the input clock signal. Although such a circuit can be implemented by using a delay circuit, it is difficult for the circuit to compensate for an absolute value of the delay. In addition, it is easier to manage the phase of the clock signal than the delay considering the versatility of the phase-locked loop circuit.

Thus, a phase-locked loop circuit is required that can generate a compensable phase difference in order to produce a synchronous clock signal. Recently, such a circuit is implemented in the form of a DLL (Delay Locked Loop).

FIG. 5 is a block diagram showing a configuration of a conventional phase-locked loop circuit. In FIG. 5, the reference numeral 101 designates a PFD (phase frequency detector) having its first input terminal supplied with an input clock signal CLK, and its second input terminal supplied with a feedback clock signal FBCLK which will be described later; 102 designates a charge pump; 103 designates a lowpass filter; and 104 designates a VCO (Voltage controlled oscillator). The clock signal CLK0 output from the VCO 104 is supplied to an internal circuit 105 of the LSI. The internal circuit 105, on the other hand, supplies the feedback clock signal FBCLK to the second input terminal of the PFD 101 so as to control the output clock signal CLK0 such that synchronization is established between the input clock signal CLK and the feedback clock signal FBCLK.

FIG. 6 is a block diagram showing the PFD 101 and the charge pump 102 constituting the phase-locked loop circuit. The PFD 101 converts the phase difference between the input clock signal CLK and the feedback clock signal FBCLK into a pulse width (time period). FIG. 7 shows an example of the PFD 101.

The PFD 101 as shown in FIG. 7 has its input terminal PINP supplied with the input clock signal CLK, and its input terminal PINN supplied with the feedback clock signal FBCLK, and outputs a pulse with a width corresponding to the phase difference between the input clock signal CLK and the feedback clock signal FBCLK from an output terminal OUTP and an output terminal OUTN.

Next, the operation of the conventional PLL will be described.

FIGS. 8A, 8B and 8C are timing charts illustrating the input and output signals of the PFD 101 as shown in FIG. 6. FIG. 8A illustrates a case where the phase of the input clock signal CLK leads that of the feedback clock signal FBCLK. In this case, the PFD 101 outputs from its positive output terminal OUTP the output pulse with a width corresponding to the phase difference between the input clock signal CLK and the feedback clock signal FBCLK. FIG. 8C illustrates a case where the phase of the input clock signal CLK lags behind that of the feedback clock signal FBCLK. In this case, the PFD 101 outputs from its negative output terminal OUTN the output pulse with a width corresponding to the phase difference between the input clock signal CLK and the feedback clock signal FBCLK.

FIG. 8B illustrates a case where the phase of the input clock signal CLK is synchronized with that of the feedback clock signal FBCLK, in which case the PFD 101 outputs two pulses with the same width. The two output pulses of the PFD 101 with the same width cause the output current of the charge pump 102 to be canceled to zero, thereby establishing the synchronization of the phase-locked loop circuit. In other words, the phase-locked loop circuit is brought into synchronization when the two output of the PFD 101 have the same pulse width.

In the foregoing operation, the width of a pulse P with a narrow width as illustrated in FIGS. 8A–8C is determined by a delay time of a delay circuit 111 of FIG. 7. The delay circuit 111 is implemented by connecting an even number of inverters in cascade. The delay circuit 111 can be interposed at a position denoted by broken lines.

FIGS. 9A and 9B are graphs obtained by plotting the average output current of the charge pump 102 against the phase difference between the input clock signal CLK and the feedback clock signal FBCLK of the circuit as shown in FIG. 6: FIG. 9A illustrates the case where the pulse P with the narrow width is not output; and FIG. 9B illustrates the case where the pulse P is output. The zero-slope section D of FIG. 9A is called a dead band, in which the gain of the circuit is zero, thereby preventing the phase-locked loop circuit from operating. Such a characteristic is due to the delay of each component of the PFD 101. The delay of these components can bring about such a case as the pulse corresponding to the phase difference between the input clock signal CLK and the feedback clock signal FBCLK is not produced even if there is such a phase difference. To avoid it, the dead band D must be eliminated by producing the pulse P with the narrow width.

The charge pump 102 connected after the PFD 101 converts the pulse width (time period) output from the PFD 101 into current or charges. For example, when a high level signal UP is supplied to its positive input terminal CINP, the charge pump 102 outputs a positive current, whereas when a high level signal DN is supplied to its negative input terminal, it outputs a negative current. FIGS. 10A and 10B each show an example of the charge pump 102.

In the conventional phase-locked loop circuit with the foregoing configuration, it is difficult for the PFD 101 to detect the clock signal with a phase difference of 90 degrees. In addition, since the other components of the phase-locked loop circuit such as the charge pump 102, the lowpass filter 103 and the VCO 104 do not have the function to detect the phase, they cannot detect the clock signal with the phase difference of 90 degrees. Although it might be detected by adding the frequency multiplication function to the phase-locked loop circuit using a frequency divider or the like, it is also difficult considering the delay of the internal circuit 105 of the LSI as shown in FIG. 5. From the viewpoint of the phase difference compensation, it will be most preferable to establish 90-degree phase difference between the clock pulse and the feedback clock signal FBCLK supplied to the phase-locked loop circuit. Accordingly, an issue arises that it is necessary to construct a phase-locked loop circuit that can produce the output clock signal with the phase difference of 90 degrees with respect to the input clock signal by changing the configuration of the conventional phase-locked loop.

SUMMARY OF THE INVENTION

The present invention is implemented to solve the foregoing problem. It is therefore an object of the present invention to provide a phase-locked loop circuit capable of producing an output clock signal with a compensated phase difference with respect to the input clock signal.

According to a first aspect of the present invention, there is provided a phase-locked loop circuit comprising: a first phase detector for detecting a phase difference between an input clock signal and a feedback clock signal; a second phase detector for detecting a phase difference between an inverted signal of the input clock signal and the feedback clock signal; a charge pump having its positive input terminal supplied with a positive output of the first phase detector, and its negative input terminal supplied with a negative output of the second phase detector; and a voltage controlled oscillator for oscillating an output clock signal under control of an output signal of the charge pump.

Here, the phase-locked loop circuit may further comprise a lowpass filter connected between the charge pump and the voltage controlled oscillator.

According to a second aspect of the present invention, there is provided a phase-locked loop circuit comprising: a first phase detector for detecting a phase difference between an input clock signal and an inverted signal of a feedback clock signal; a second phase detector for detecting a phase difference between the input clock signal and the feedback clock signal; a charge pump having its positive input terminal supplied with a positive output of the first phase detector, and its negative input terminal supplied with a negative output of the second phase detector; and a voltage controlled oscillator for oscillating an output clock signal under control of an output signal of the charge pump.

Here, the phase-locked loop circuit may further comprise a lowpass filter connected between the charge pump and the voltage controlled oscillator.

DETAILED DESCRIPTION OF THE PREFERRED EMBODIMENTS

The invention will now be described with reference to the accompanying drawings.

Embodiment 1

Figure 1:
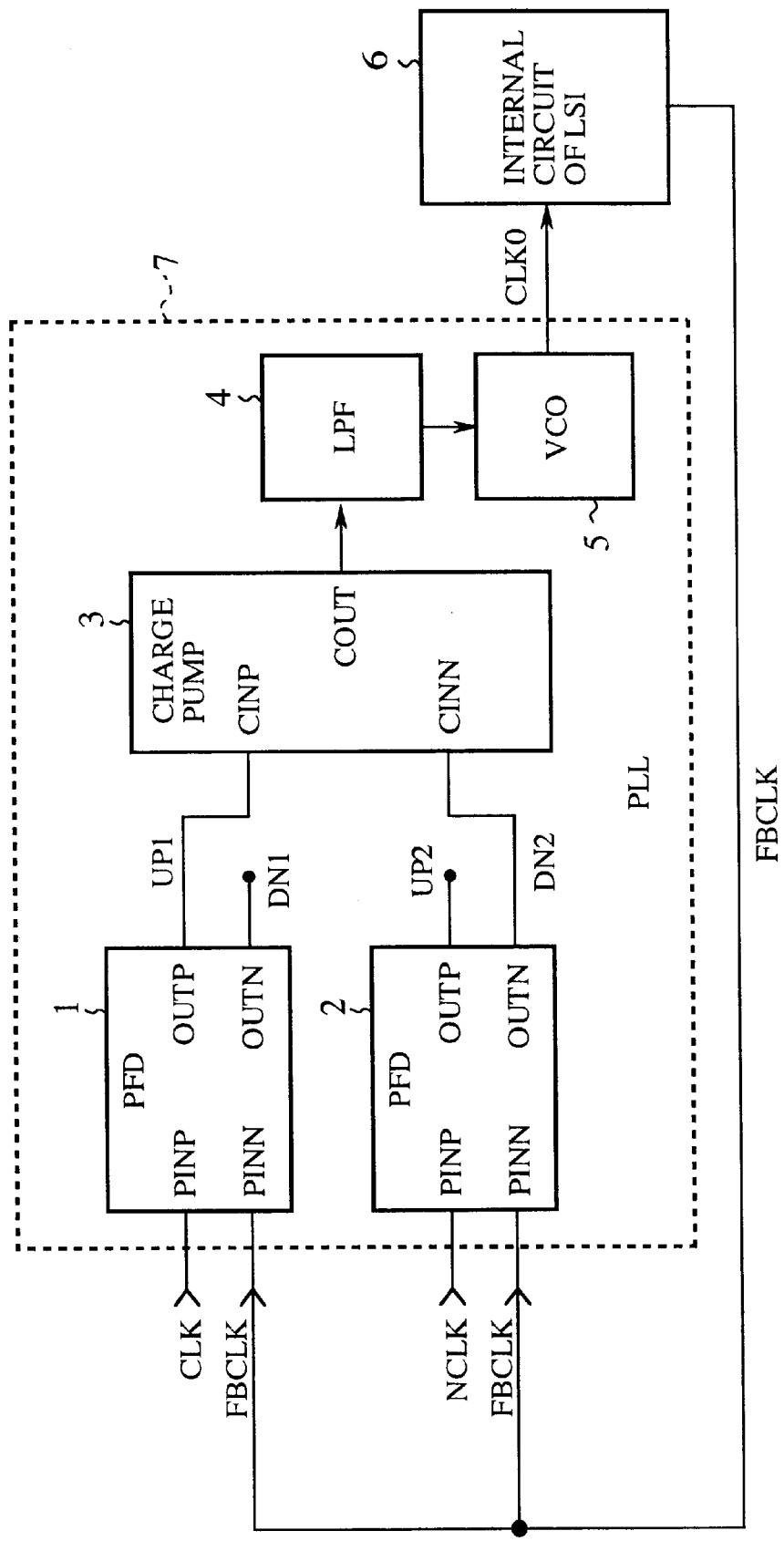
FIG. 1 is a block diagram showing a configuration of an embodiment 1 of the phase-locked loop circuit in accordance with the present invention.
Figure 5:
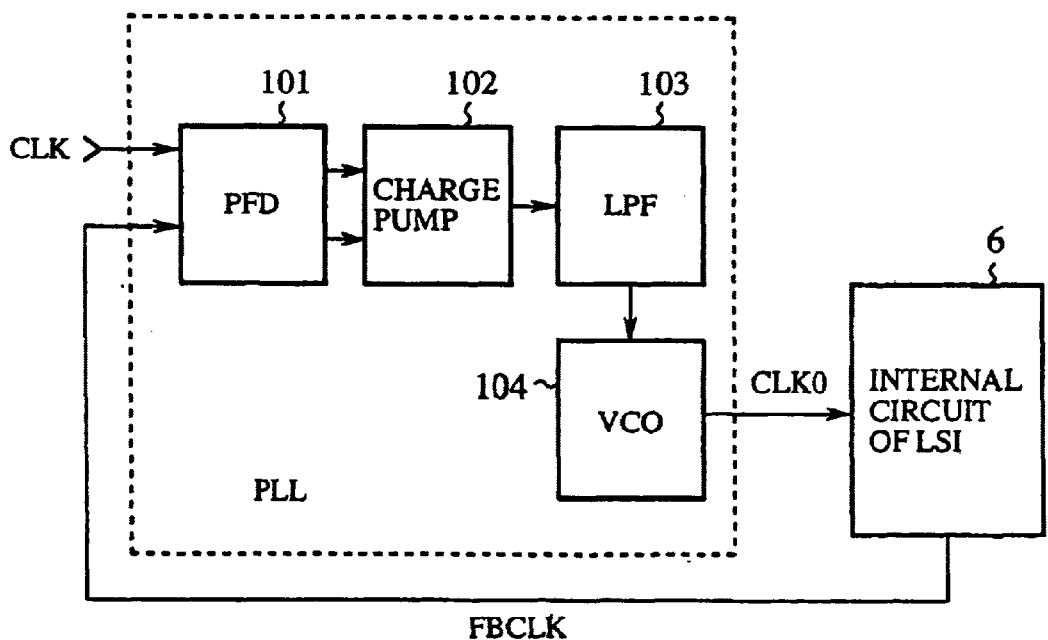
FIG. 5 is a block diagram showing a configuration of a conventional phase-locked loop circuit.
Figure 6:
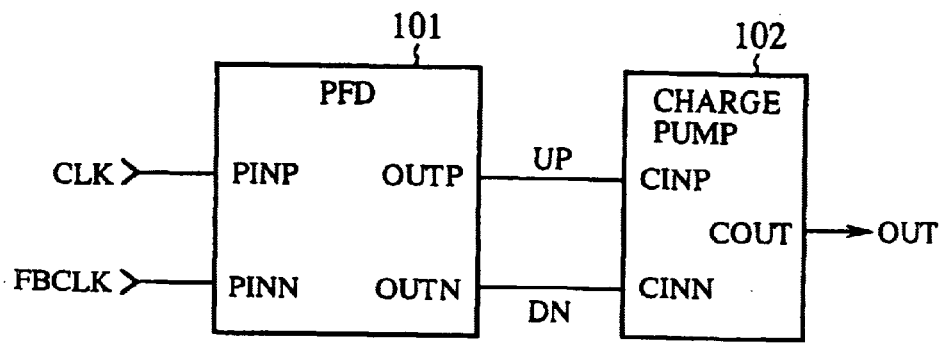
FIG. 6 is a block diagram showing a PFD and a charge pump constituting the conventional phase-locked loop circuit as shown in FIG. 5.
Figure 7:
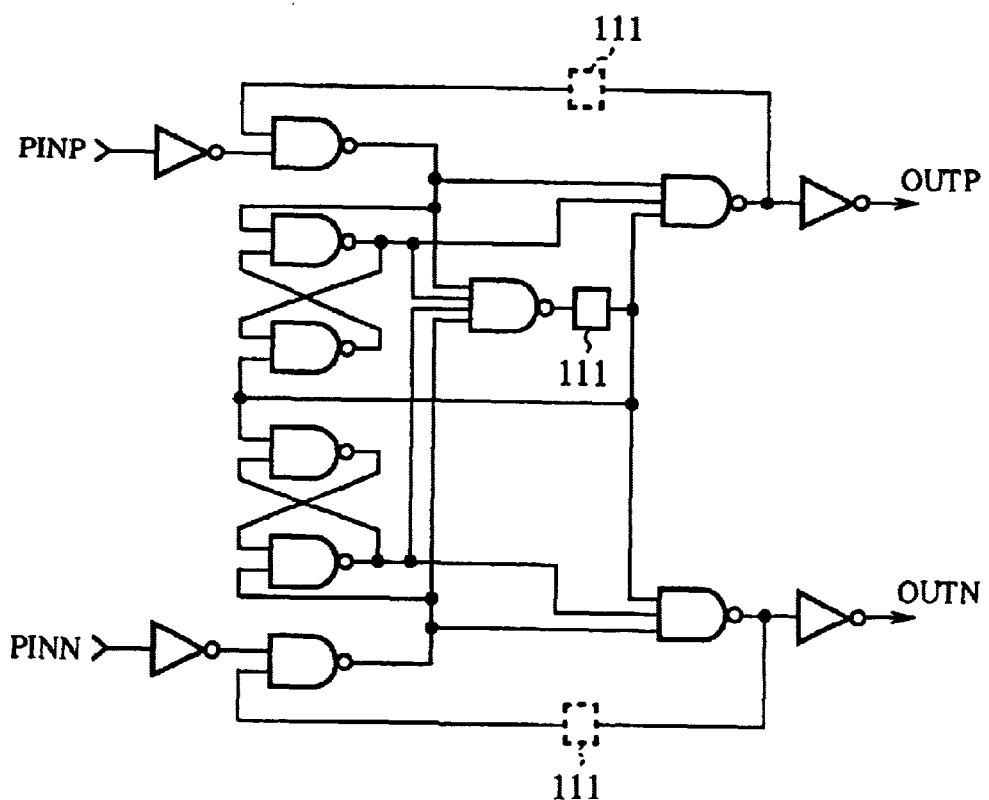
FIG. 7 is a circuit diagram showing a configuration of the PFD constituting the phase-locked loop circuit.
Figure 8A:
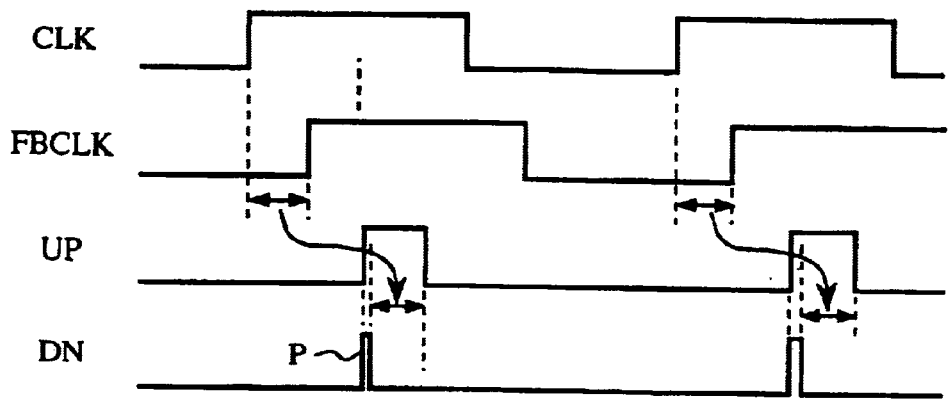
FIGS. 8A–8C are timing charts illustrating the operation of the PFD.
Figure 8B:
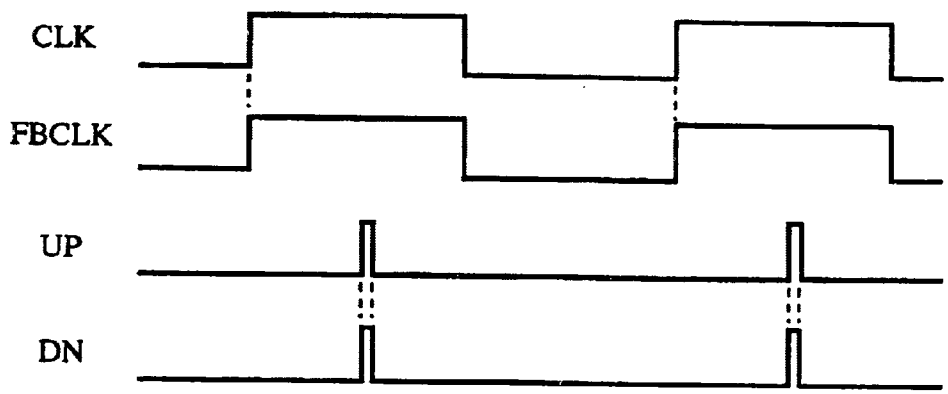
Figure 8C:
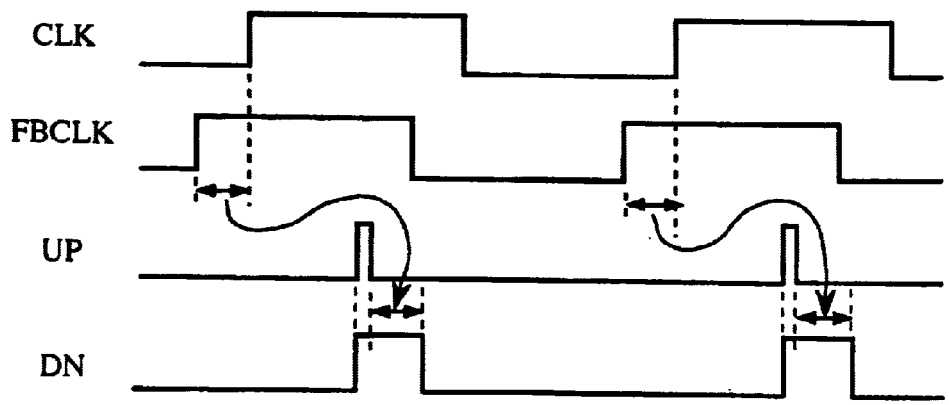
Figure 9A:
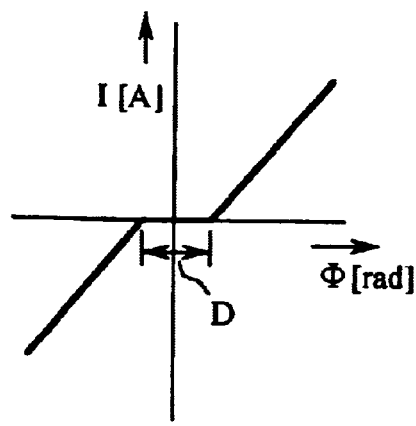
FIGS. 9A and 9B are graphs illustrating characteristics of the average output current of the charge pump against the phase difference between the input clock signal CLK and the feedback clock signal FBCLK.
Figure 9B:
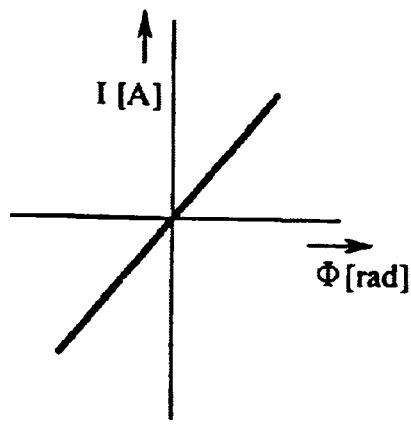
Figure 10A:
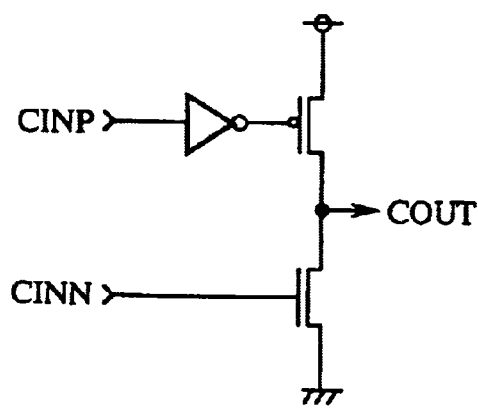
FIGS. 10A and 10B are circuit diagrams showing a configuration of the charge pump constituting the phase-locked loop circuit.
Figure 10B:
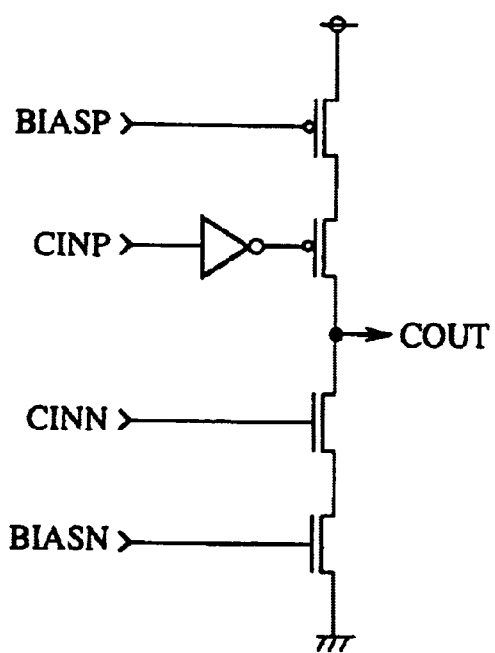

FIG. 1 is a block diagram showing a configuration of an embodiment 1 of a phase-locked loop circuit in accordance with the present invention. The phase-locked loop circuit 7 comprises two PFDs (phase frequency detector) 1 and 2; a charge pump 3 receiving the outputs of the two PFDs 1 and 2; a lowpass filter 4 for passing only the low-frequency component of the output of the charge pump 3; and a VCO (voltage controlled oscillator) 5 for oscillating a clock signal in response to the output of the lowpass filter 4. The clock signal output from the VCO 5 is supplied to an internal circuit 6 of an LSI so that the internal circuit 6 feeds a feedback clock signal FBCLK back to the PFDs 1 and 2. As the PFDs 1 and 2, the conventional PFD as shown in FIG. 7 can be utilized. As the charge pump 3, the conventional charge pump as shown in FIG. 10A or 10B can be used. Besides, as the lowpass filter 4 and the VCO 5, conventional lowpass filter and VCO as shown in FIG. 5 can be utilized.

The PFD 1 has its first input terminal PINP supplied with an input clock signal CLK, and its second input terminal PINN supplied with the feedback clock signal FBCLK. On the other hand, the PFD 2 has its first input terminal PINP supplied with the inverted input clock signal NCLK, and its second input terminal PINN supplied with the feedback clock signal FBCLK. The PFD 1 has its positive output terminal OUTP connected to the positive input terminal CINP of the charge pump 3, and the PFD 2 has its negative output terminal OUTN connected to the negative input terminal CINN of the charge pump 3.

Next, the operation of the present embodiment 1 will be described.

Figure 2:
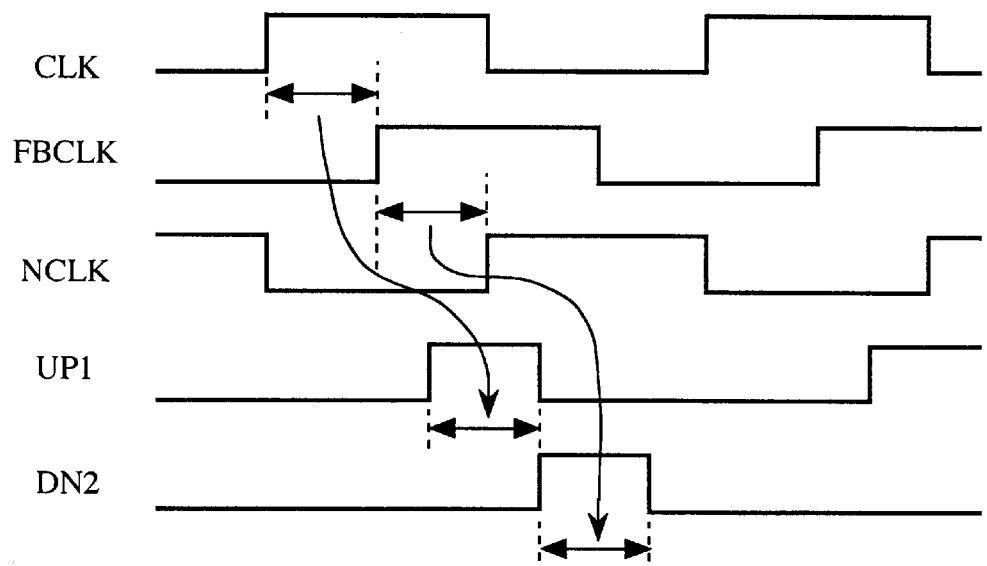
FIG. 2 is a timing chart illustrating the operation of the PFDs of the embodiment 1.

FIG. 2 is a timing chart illustrating the operation of the PFDs 1 and 2 as shown in FIG. 1. Comparing the input clock signal CLK and the feedback clock signal FBCLK, the PFD 1 produces its output UP1 from its positive output terminal OUTP. The pulse width of the output UP1 corresponds to the phase difference between the input clock signal CLK and the feedback clock signal FBCLK. On the other hand, comparing the inverted input clock signal NCLK with the feedback clock signal FBCLK, the PFD 2 produces its output DN2 from its negative output terminal OUTN. The pulse width of the output DN2 corresponds to the phase difference between the inverted input clock signal NCLK and the feedback clock signal FBCLK.

When the pulse width of the output UP1 from the PFD 1 becomes equal to that of the output DN2 from the PFD 2, the synchronization of the phase-locked loop circuit is established. In other words, when the rising edge of the feedback clock signal FBCLK takes place at the midpoint between the rising edge of the input clock signal CLK and the inverted input clock signal NCLK, that is, when the phase of the feedback clock signal FBCLK lags behind the phase of the input clock signal CLK by 90 degrees, the synchronization of the phase-locked loop circuit is established.

Thus, the circuit configuration can implement a phase-locked loop circuit that outputs the clock signal whose phase lags behind the phase of the input clock signal CLK by 90 degrees. Therefore, when the data and the clock signal are supplied to the chip, and the phase of the data lags behind or is identical to the phase of the input clock signal, the present phase-locked loop circuit that delays the phase of the output clock signal by 90 degrees with respect to that of the input clock signal is very effective.

Incidentally, since the negative output terminal DN1 of the PFD 1 and the positive output terminal UP2 of the PFD 2 have nothing to do with the operation of the present embodiment 1, their outputs are not shown in the timing chart of FIG. 2.

As described above, the present embodiment 1 can implement a phase-locked loop circuit that can output the clock signal whose phase lags behind the phase of the input clock signal CLK by 90 degrees. Accordingly, it offers an advantage of being able to increase the accuracy of capturing data.

Embodiment 2

Figure 3:
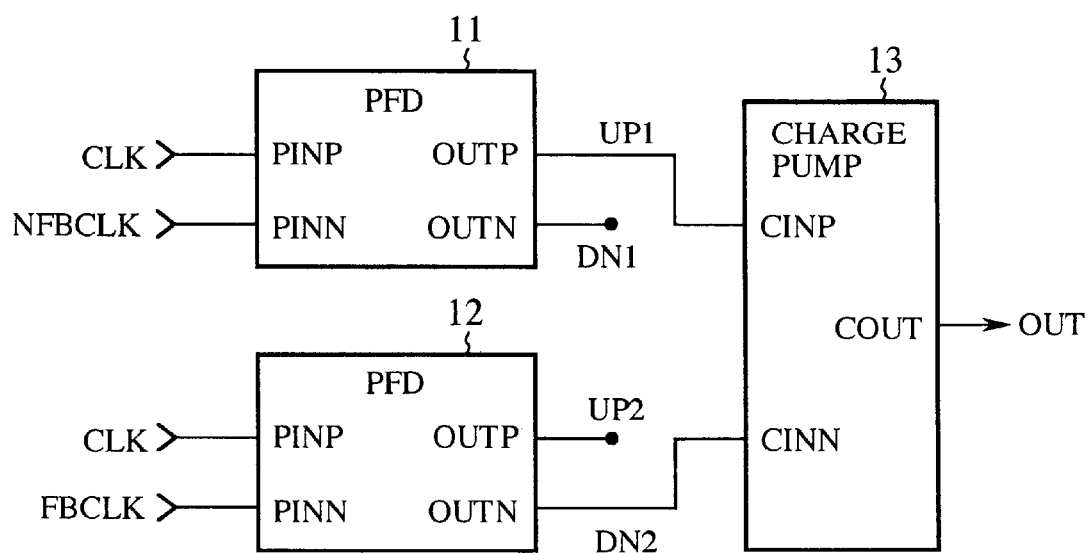
FIG. 3 is a block diagram showing a configuration of PFDs and a charge pump of an embodiment 2 of the phase-locked loop circuit in accordance with the present invention.

FIG. 3 is a block diagram showing a main portion of an embodiment 2 of a phase-locked loop circuit in accordance with the present invention. The portion of the phase-locked loop circuit comprises two PFDs 11 and 12; and a charge pump 13 receiving the outputs of the two PFDs 11 and 12.

The PFD 11 has its first input terminal PINP supplied with the input clock signal CLK, and its second input terminal PINN supplied with an inverted feedback clock signal NFBCLK. On the other hand, the PFD 12 has its first input terminal PINP supplied with the input clock signal CLK, and its second input terminal PINN supplied with the feedback clock signal FBCLK. The PFD 11 has its positive output terminal OUTP connected to the positive input terminal CINP of the charge pump 13, and the PFD 12 has its negative output terminal OUTN connected to the negative input terminal CINN of the charge pump 13. Since the remaining configuration of the phase-locked loop circuit is the same as that of FIG. 1, the description thereof is omitted here.

Next, the operation of the present embodiment 2 will be described.

Figure 4:
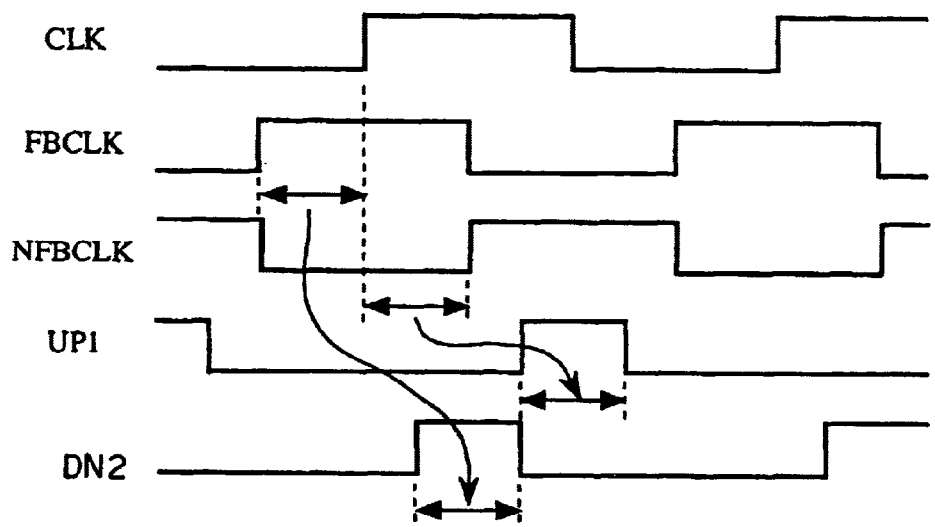
FIG. 4 is a timing chart illustrating the operation of the PFDs of the embodiment 2.

FIG. 4 is a timing chart illustrating the operation of the PFDs 11 and 12 as shown in FIG. 2. Comparing the input clock signal CLK and the inverted feedback clock signal NFBCLK, the PFD 11 produces its output UP1 from the positive output terminal OUTP. The pulse width of the output UP1 corresponds to the phase difference between the input clock signal CLK and the inverted feedback clock signal NFBCLK. On the other hand, comparing the input clock signal CLK with the feedback clock signal FBCLK, the PFD 12 produces its output DN2 from the negative output terminal OUTN. The pulse width of the output DN2 corresponds to the phase difference between the input clock signal CLK and the feedback clock signal FBCLK.

The operation principle of the present embodiment 1 is the same as that of the foregoing embodiment 1. When the pulse width of the output UP1 becomes equal to that of the output DN2, the synchronization of the phase-locked loop circuit is established. In other words, when the rising edge of the input clock signal CLK takes place at the midpoint between the rising edge of the feedback clock signal FBCLK and the rising edge of the inverted feedback clock signal NFBCLK, that is, when the phase of the feedback clock signal FBCLK leads the phase of the input clock signal CLK by 90 degrees, the synchronization of the phase-locked loop circuit is established.

Thus, the circuit configuration can implement a phase-locked loop circuit that outputs the clock signal whose phase leads the phase of the input clock signal CLK by 90 degrees. Therefore, when the data and the clock signal are supplied to the chip, and the phase of the data is shifted by half a period or leads that of the input clock signal, the present phase-locked loop circuit that advances the phase of the output clock signal by 90 degrees with respect to that of the input clock signal is very effective.

Incidentally, since the negative output terminal DN1 of the PFD 11 and the positive output terminal UP2 of the PFD 12 have nothing to do with the operation of the present embodiment 2, their outputs are not shown in the timing chart of FIG. 4.

As described above, the present embodiment 2 can implement a phase-locked loop circuit that can output the clock signal whose phase leads the phase of the input clock signal CLK by 90 degrees. Accordingly, it offers an advantage of being able to increase the accuracy of capturing data.

What is claimed is:

1. A phase-locked loop circuit comprising:
   a first phase detector for detecting a phase difference between an input clock signal and a feedback clock signal;
   a second phase detector for detecting a phase difference between an inverted signal of the input clock signal and the feedback clock signal;
   a charge pump having a positive input terminal to which a positive output of said first phase detector is directly input, and a negative input terminal to which a negative output of said second phase detector is directly input; and
   a voltage controlled oscillator for oscillating an output clock signal under control of an output signal of said charge pump, wherein a phase of the feedback clock signal, which is generated as a function of the phase-locked loop circuit, is delayed by 90° from the input clock signal.

2. The phase-locked loop circuit according to claim 1, further comprising a lowpass filter connected between said charge pump and said voltage controlled oscillator.

3. A phase-locked loop circuit comprising:
   a first phase detector for detecting a phase difference between an input clock signal and an inverted signal of a feedback clock signal;
   a second phase detector for detecting a phase difference between the input clock signal and the feedback clock signal;
   a charge pump having a positive input terminal to which a positive output of said first phase detector is directly input, and a negative input terminal to which a negative output of said second phase detector is directly input; and
   a voltage controlled oscillator for oscillating an output clock signal under control of an output signal of said charge pump, wherein a phase of the feedback clock signal, which is generated as a function of the phase-locked loop circuit, is advanced by 90° from the input clock signal.

4. The phase-locked loop circuit according to claim 3, further comprising a lowpass filter connected between said charge pump and said voltage controlled oscillator.

* * * * *